US012699263B2

(12) United States Patent
Tanguep Njiokep et al.

(10) Patent No.: US 12,699,263 B2
(45) Date of Patent: Aug. 4, 2026

(54) MICROMECHANICAL OSCILLATION SYSTEM

(71) Applicant: Robert Bosch GmbH, Stuttgart (DE)

(72) Inventors: Eugene Moliere Tanguep Njiokep, Reutlingen (DE); Frank Schatz, Kornwestheim (DE); Helmut Grutzeck, Kusterdingen (DE); Stefan Pinter, Reutlingen (DE); Johannes Baader, Haslach (DE); Rainer Straub, Ammerbuch (DE); Timo Schary, Aichtal-Neuenhaus (DE)

(73) Assignee: ROBERT BOSCH GMBH, Stuttgart (DE)

( * ) Notice: Subject to any disclaimer, the term of this patent is extended or adjusted under 35 U.S.C. 154(b) by 980 days.

(21) Appl. No.: 17/634,360

(22) PCT Filed: Oct. 1, 2020

(86) PCT No.: PCT/EP2020/077493
§ 371 (c)(1),
(2) Date: Feb. 10, 2022

(87) PCT Pub. No.: WO2021/078487
PCT Pub. Date: Apr. 29, 2021

(65) Prior Publication Data
US 2022/0283427 A1 Sep. 8, 2022

(30) Foreign Application Priority Data
Oct. 21, 2019 (DE) ..................... 10 2019 216 154.5

(51) Int. Cl.
*G02B 26/08* (2006.01)
*B81B 3/00* (2006.01)
*G02B 26/10* (2006.01)

(52) U.S. Cl.
CPC .......... *G02B 26/085* (2013.01); *B81B 3/0045* (2013.01); *G02B 26/101* (2013.01); *B81B 2201/042* (2013.01)

(58) Field of Classification Search
CPC ................ G02B 26/08; G02B 26/0816; G02B 26/0833; G02B 26/0841; G02B 26/085;
(Continued)

(56) References Cited

U.S. PATENT DOCUMENTS 6,201,629 B1 3/2001 McClelland et al.
2002/0122238 A1* 9/2002 Knipe .................. H04N 5/7458
348/E5.142
(Continued)

FOREIGN PATENT DOCUMENTS

DE 102013212102 A1 1/2015
DE 102016220514 A1 4/2018
(Continued)

OTHER PUBLICATIONS

International Search Report for PCT/EP2020/077493, Issued Feb. 1, 2021.

*Primary Examiner* — Stephone B Allen
*Assistant Examiner* — Adam W Booher
(74) *Attorney, Agent, or Firm* — NORTON ROSE FULBRIGHT US LLP

(57) ABSTRACT
A micromechanical oscillation system that is designed as a micromirror system. The micromechanical oscillation system includes a micromechanical oscillating body that includes at least one micromirror. The micromechanical oscillating body is designed to oscillate about an oscillation axis, in particular at a resonant frequency of the oscillating body. The micromechanical oscillating body has a total mass made up of mass elements. The mass elements are distributed as a function of a lateral horizontal spacing of the mass elements from the oscillation axis.

9 Claims, 7 Drawing Sheets

(58) Field of Classification Search
CPC ............ G02B 26/0858; G02B 26/0866; G02B
26/10; G02B 26/101; G02B 26/105;
B81B 3/0045; B81B 3/004; B81B 3/0048;
B81B 2201/042; B81B 2201/04
See application file for complete search history.

(56) References Cited

U.S. PATENT DOCUMENTS

| | | | | |
|---|---|---|---|---|
| 2004/0136045 | A1* | 7/2004 | Tran ........................ | G02B 7/008 |
| | | | | 359/872 |
| 2005/0243396 | A1* | 11/2005 | Fujii .................. | G02B 26/0841 |
| | | | | 347/261 |
| 2006/0158710 | A1 | 7/2006 | Yee et al. | |
| 2008/0018975 | A1 | 1/2008 | Moidu | |
| 2019/0049717 | A1* | 2/2019 | Man ...................... | B81B 7/0058 |
| 2019/0219814 | A1* | 7/2019 | Finn ...................... | B81B 3/0045 |
| 2022/0057625 | A1* | 2/2022 | Hirata ............... | G02B 26/0833 |

FOREIGN PATENT DOCUMENTS

| | | | |
|---|---|---|---|
| EP | 1275997 | A2 | 1/2003 |
| EP | 1640781 | A2 | 3/2006 |
| EP | 1757972 | A1 | 2/2007 |
| EP | 1773596 | B1 | 11/2013 |
| WO | 2013081458 | A2 | 6/2013 |

* cited by examiner

START provide first silicon oxide substrate — 200 structure micro-mirror — 210 provide second silicon oxide substrate — 230 structure carrier unit — 240 create recess — 250 connect micro-mirror to carrier unit — 260

END

MICROMECHANICAL OSCILLATION SYSTEM

FIELD

The present invention relates to a micromechanical oscillation system, in particular a micromirror system, a microprojection device that includes a micromechanical oscillation system, and a method for manufacturing a micromechanical oscillation system.

BACKGROUND INFORMATION

European Patent No. EP 1 773 596 B1 describes a micromechanical resonator system, for example a micromirror scanner. The moment of inertia of the oscillating system is reduced due to a certain arrangement of a coil and a permanent magnet of the electromagnetic drive unit of the micromirror system.

An object of the present invention is to provide an energy-efficient micromechanical oscillation system.

SUMMARY

The object may be achieved by providing a micromechanical oscillation system according to present invention. In accordance with an example embodiment of the present invention, the micromechanical oscillation system is in particular designed as a micromirror system, as used in a microprojection device, for example. The micromechanical oscillation system includes a micromechanical oscillating body that includes at least one micromirror. The micromechanical oscillating body is designed to oscillate about an oscillation axis. In other words, the micromechanical oscillating body rotates about the oscillation axis. In particular, the oscillating body oscillates about the oscillation axis at a resonant frequency of the oscillating body. In particular, a drive unit is provided for exciting the oscillation. This may be an electromagnetic drive unit, an electrostatic drive unit, or a piezoelectric drive unit, for example. The micromechanical oscillating body has a total mass m that is in particular connected to springs, so that total mass m is supported in a rotationally elastic manner. The micromechanical oscillating body having total mass m is made up of a plurality of mass elements $m_i$. Mass elements $m_i$ are in turn distributed as a function of a lateral spacing of mass elements $m_i$ from the oscillation axis. The "lateral spacing of the mass elements from the oscillation axis" may in particular be understood to mean the distance of mass elements from the oscillation axis in a direction in parallel to the main plane of extension of the micromirror. Mass elements $m_i$ may be designed, for example, as infinitesimally small, rectangular mass elements. However, mass elements $m_i$ may also be designed as section segments of the micromechanical oscillating body, the sections of the micromechanical oscillating body being provided along the oscillation axis of the micromechanical oscillation system. The segments thus extend in the shape of disks from the oscillation axis toward the outer area of the micromechanical oscillating body. In this regard, it is preferably provided that the distribution of mass elements $m_i$ is reduced as a function of the lateral spacing of mass elements $m_i$ from the oscillation axis. Thus, the farther away mass elements $m_i$ are situated from the rotational axis, the smaller is the mass of the section segments described above, for example. The total moment of inertia of the outer area of the micromechanical oscillating body is thus reduced. As a result, the micromirror, in particular for static deflection, may in turn be operated with quick control and in an energy-efficient manner despite a high natural frequency, since the necessary spring stiffness for the high natural frequencies is low.

In accordance with an example embodiment of the present invention, the micromechanical oscillating body preferably additionally includes a carrier unit for carrying at least one coil unit. Such a carrier unit frequently has a rectangular shape in the top view, and with respect to the oscillation axis has a lateral extension in a plane in parallel to the main plane of extension of the micromirror. The mass of the carrier unit thus also contributes to the total moment of inertia of the outer area of the micromechanical oscillating body. The coil unit is the coil unit of an electromagnetic drive unit of the micromechanical oscillating body. The carrier unit is preferably designed as two struts, one situated on each side of the oscillation axis, which are designed to span the coil unit. Such struts have only a small mass, as the result of which the total moment of inertia of the outer area of the micromechanical oscillating body is reduced. A particular strut preferably has a main direction of extension perpendicular to the oscillation axis. In the outer area of the micromechanical oscillating body situated relative to the oscillation axis, the coil unit of the micromechanical oscillating body is preferably made of a metal having a density less than 4 $g/cm^3$. The metal may be aluminum, for example. In this regard, in an inner area of the micromechanical oscillating body situated relative to the oscillation axis, the coil unit is made of a metal having a density greater than 4 $g/cm^3$. The metal may be copper, for example. The total moment of inertia of the outer area of the micromechanical oscillating body is thus reduced. The micromirror in a top view preferably completely covers the coil unit. Such micromirrors have a large extension in the lateral direction relative to the oscillation axis, and correspondingly make a significant contribution to the total moment of inertia in the outer area of the micromechanical oscillating body.

In an outer area of the micromechanical oscillating body situated relative to the oscillation axis, the micromechanical oscillating body preferably includes at least one recess on both sides of the oscillation axis. The two sides of the oscillation axis are in particular situated in a plane in parallel to a main plane of extension of the micromirror. The mass in the outer area of the micromechanical oscillating body is reduced due to the at least one recess. The recess in particular is provided on a side of the micromechanical oscillating body opposite from a side of the micromirror that reflects incident light. Thus, the functioning of the micromechanical oscillating body, in particular the micromirror, is not disturbed by the at least one recess. The at least one recess in a top view preferably has the shape of a hexagonal prism. Alternatively, the at least one recess in a top view has a rectangular design. The hexagonal shape, despite the reduction of the mass, ensures high stability. In the outer area of the micromechanical oscillating body situated relative to the oscillation axis, the micromechanical oscillating body preferably includes a plurality of recesses on both sides of the oscillation axis. An extension of the recesses in the longitudinal direction and/or the transverse direction of the recesses preferably increases as a function of a lateral spacing of the recesses from the oscillation axis. Thus, the farther away a recess is situated from the oscillation axis in the lateral direction, the larger is the recess. Correspondingly, the distribution of the mass of the micromechanical oscillating body is thus reduced toward the outside. The micromechanical oscillation system preferably additionally includes two springs, in particular torsion springs, for suspending the oscillating body at a static body, for example at a rigid frame of the oscillating body. In this regard, the micromirror includes at least one second recess in an area above the springs. An open space is thus provided below the micromirror for the freedom of movement of the springs. In addition, the installation size is thus limited to the mirror size, since no additional lateral space for the springs is necessary.

A further subject matter of the present invention relates to a microprojection device that includes the micromechanical oscillation system described above. In such a microprojection device, the micromirror is used to project light, which, for example, is radiated from a laser unit onto the micromirror, onto a screen.

Moreover, the present invention encompasses a method for manufacturing a micromechanical oscillation system. In accordance with an example embodiment of the present invention, a first silicon oxide substrate is initially provided. A micromirror of a micromechanical oscillating body is subsequently structured out of the first silicon oxide substrate, for example with the aid of an etching process. In addition, at least one recess is created on both sides of an oscillation axis of the micromechanical oscillating body in an outer area of the micromechanical oscillating body situated relative to the oscillation axis, for example with the aid of a first cavity in each case. A second silicon oxide substrate is preferably also provided. A carrier unit for carrying at least one coil unit of the micromechanical oscillating body is subsequently structured out of the second silicon oxide substrate, for example with the aid of an etching process. In addition, the micromirror is connected to the carrier unit, in particular with the aid of a silicon oxide layer.

DETAILED DESCRIPTION OF EXAMPLE EMBODIMENTS

Figure 1B:
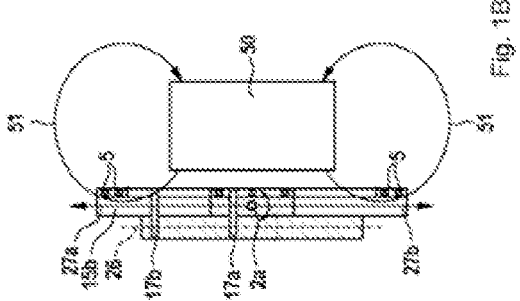
FIG. 1B shows a cross section of the first specific embodiment of the micromechanical oscillation system, in accordance with the present invention.
Figure 1A:
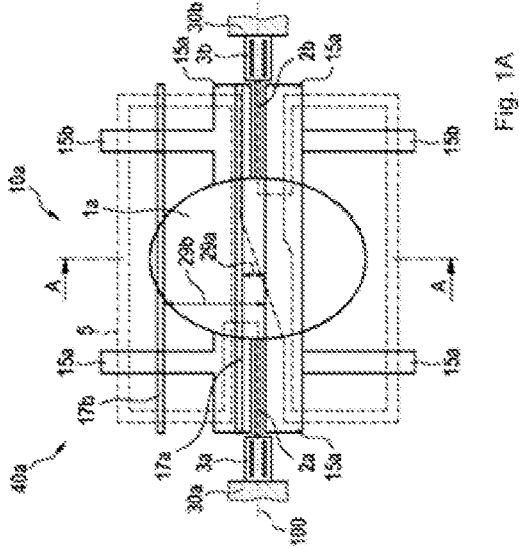
FIG. 1A shows a first specific embodiment of a micromechanical oscillation system in a top view, in accordance with the present invention.

FIGS. 1A and 1B show a first specific embodiment of a micromechanical oscillation system 40a that is designed as a micromirror system. Micromechanical oscillation system 40a includes a micromechanical oscillating body 10a with a micromirror 1a, which in this specific embodiment is oval. In addition, the micromechanical oscillating body includes a carrier unit 15a and 15b for a coil unit 5. Coil unit 5 is part of an electromagnetic drive unit of micromechanical oscillating body 10a. As is apparent in FIG. 1B in a cross section A-A of micromechanical oscillation system 40a, micromechanical oscillation system 40a also includes a permanent magnet 50 having magnetic field lines 51. Coil unit 5 in turn is situated within magnetic field lines 51. This electromagnetic drive unit ensures that micromechanical oscillating body 10a is excited to an oscillation about an oscillation axis 100. Micromechanical oscillating body 10a oscillates in particular at the resonant frequency of micromechanical oscillating body 10a in the rotational direction illustrated in FIG. 1B. In this specific embodiment, carrier unit 15a and 15b is formed from a first inner area 15a which is rectangular in the top view, and two struts 15b, one situated on either side 27a and 27b of oscillation axis 100, as an outer area, both of the struts together spanning coil unit 5. As is apparent from FIG. 1B, the two sides 27a and 27b of oscillation axis 100 are understood to mean the two sides of oscillation axis 100, which are situated in a plane in parallel to a main plane of extension 26 of micromirror 1a.

Micromechanical oscillating body 10a has a total mass m which is made up of mass elements $m_i$ 17a and 17b, illustrated by way of example in FIG. 1B. Mass elements $m_i$ 17a and 17b are designed as section segments of micromechanical oscillating body 10a. The sections of section segments 17a and 17b extend through micromechanical oscillating body 10a along oscillation axis 100 of micromechanical oscillating body 10a. Mass elements $m_i$ 17a and 17b thus extend in the shape of disks from oscillation axis 100 toward the edge area of micromechanical oscillating body 10a. Each of these mass elements $m_i$ 17a and 17b has a certain mass, and the sum of the masses of individual mass elements 17a and 17b results in the total mass of micromechanical oscillating body 10a. Mass elements 17a and 17b are situated at different distances 29a and 29b, respectively, from oscillation axis 100, and have different masses. Due to the web-shaped design of carrier unit 15a and 15b, mass element 17b has a smaller mass in the outer area formed by webs 15 than mass element 17a in a comparatively inner area of micromechanical oscillating body 10a. The inner area is formed by inner area 15a of the carrier unit, which is rectangular in the top view. As a result, micromechanical oscillating body 10a in the outer area has a comparatively small total moment of inertia.

In addition, micromechanical oscillation system 40a includes an outer rigid frame 30a and 30b and two torsion springs with an inner section 2a, 2b and an outer section 3a and 3b for suspending micromechanical oscillating body 10a at rigid frame 30a and 30b. Outer sections 3a and 3b of the two torsion springs may include piezoresistive structures for detecting deflections.

Figure 2B:
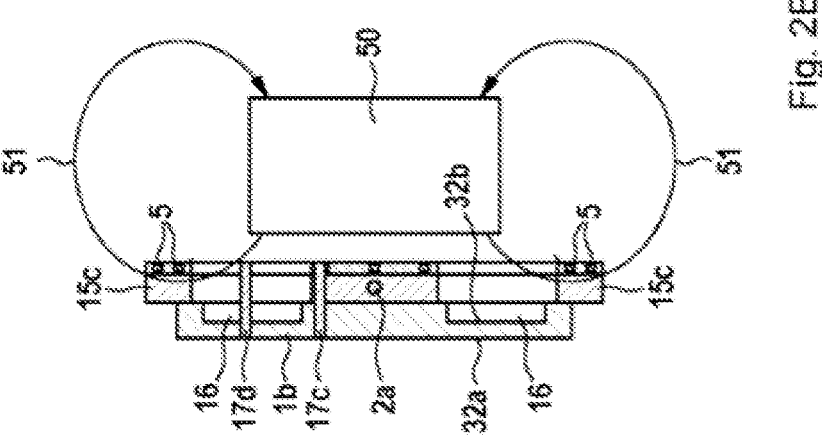
FIG. 2B shows a cross section of the second specific embodiment of the micromechanical oscillation system, in accordance with the present invention.
Figure 2A:
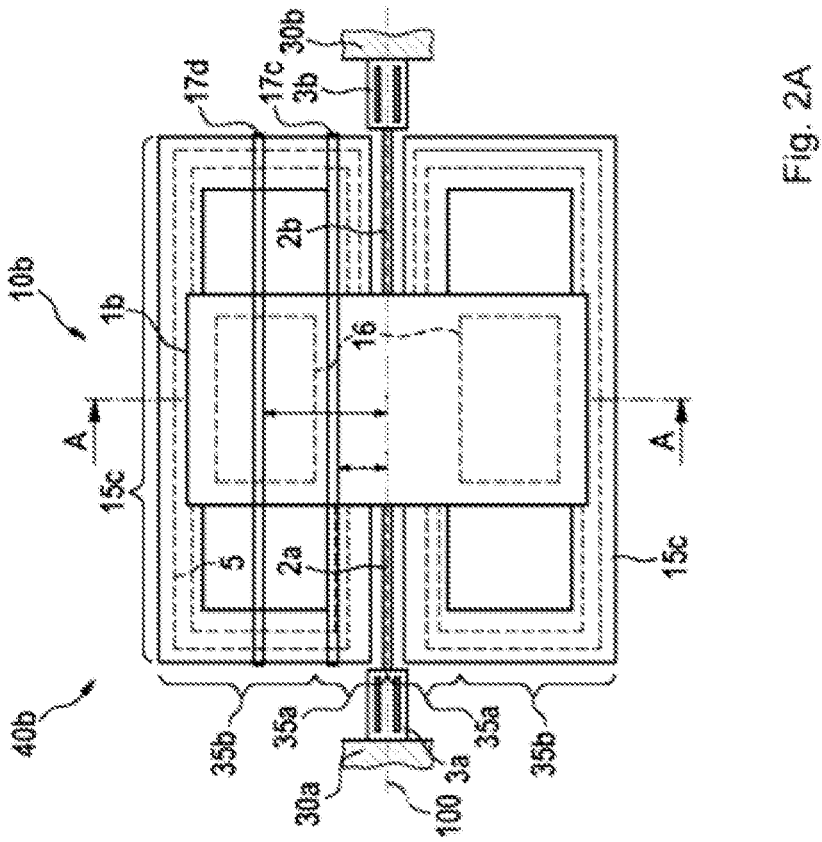
FIG. 2A shows a second specific embodiment of a micromechanical oscillation system in a top view, in accordance with the present invention.

FIGS. 2A and 2B show a second specific embodiment of a micromechanical oscillation system 40b including an oscillating body 10b. In contrast to the first specific embodiment, carrier unit 15c has a rectangular design in the top view onto FIG. 2A, and coil unit 5 is situated on the bottom side of carrier unit 15c, as is apparent from FIG. 2B. FIG. 2B is a cross section B-B of micromechanical oscillation system 40b. In this specific embodiment, micromirror 1b has a rectangular design in the top view onto FIG. 2A, and includes a likewise rectangular recess 16 on each side of oscillation axis 100 in an outer area 35b of micromechanical oscillating body 10b situated relative to oscillation axis 100. As is apparent from FIG. 2B, recesses 16 are situated on a side 32b of micromechanical oscillating body 40b situated opposite from a side 32a of micromirror 1b that reflects incident light. Due to recesses 16 in outer area 35b of micromirror 1b, the two section segments 17c and 17d once again have different masses. The mass of section segment 17c is greater than the mass of farther outwardly situated section segment 17d, as the result of which the total moment of inertia of outer area 35b of micromechanical oscillating body 10b is reduced.

For further reducing the total moment of inertia of outer area 35b of micromechanical oscillating body 10b, in this second specific embodiment coil unit 5 of micromechanical oscillating body 10b in outer area 35b of micromechanical oscillating body 10b situated relative to oscillation axis 100 is also made of a metal having a density less than 4 g/cm³, in particular aluminum. In contrast, in an inner area 35a of micromechanical oscillating body 10b situated relative to oscillation axis 100, coil unit 5 is made of a metal having a density greater than 4 g/cm³, in particular copper.

Figure 3B:
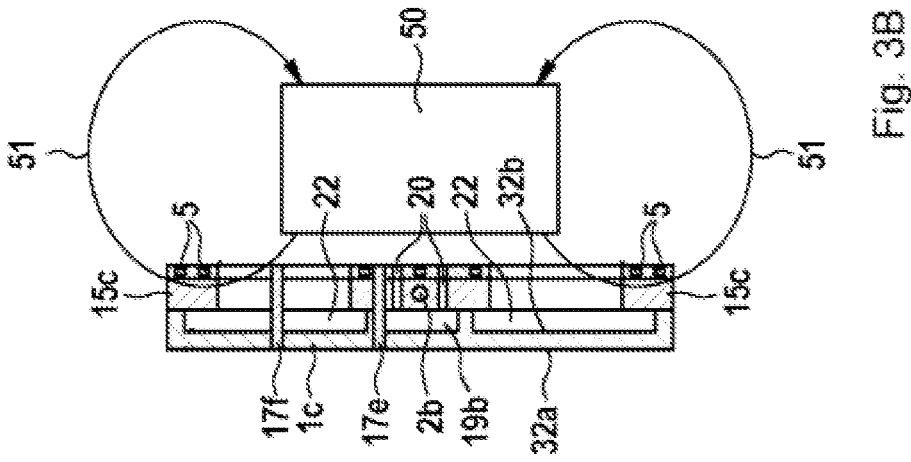
FIG. 3B shows a cross section of the third specific embodiment of the micromechanical oscillation system, in accordance with the present invention.
Figure 3A:
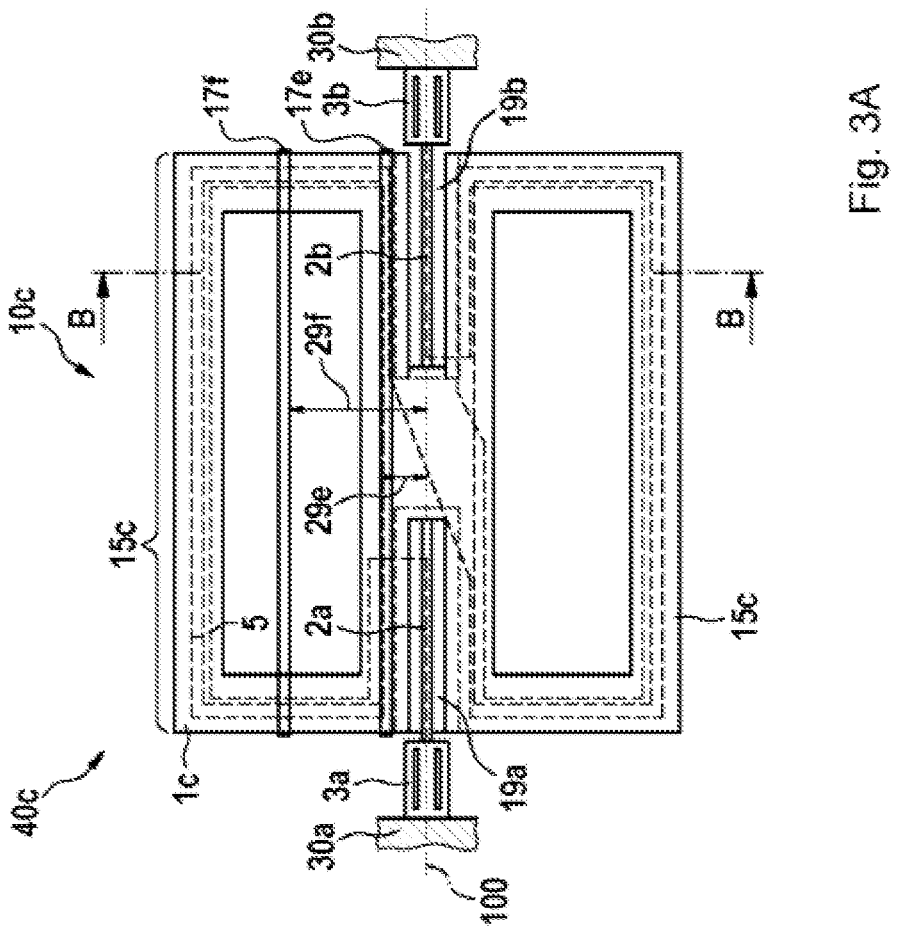
FIG. 3A shows a third specific embodiment of a micromechanical oscillation system in a top view, in accordance with the present invention.

FIGS. 3A and 3B show a third specific embodiment of a micromechanical oscillation system 40c including an oscillating body 10c. In contrast to the first and second specific embodiments, micromirror 1c includes an extension in the top view onto FIG. 3A such that micromirror 1c completely covers the coil unit. In order to reduce the total moment of inertia of the outer area of micromirror 1c, in this specific embodiment two rectangular recesses 22 are provided on side 32b of micromirror 1c. Due to these recesses 22, section segment 17f has a smaller mass than section segment 17e. Section segment 17f is situated at a greater distance 29f from oscillation axis 100 than is section segment 17e, with distance 29e.

Micromirror 1c also includes two second recesses 19a and 19b in an area above springs 3a and 3b. An open space is thus provided below micromirror 1c for the freedom of movement of the inner sections of springs 2a and 2b.

Figure 4B:
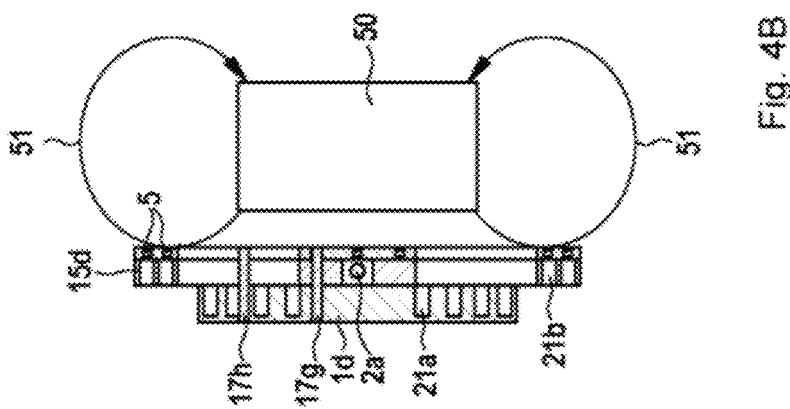
FIG. 4B shows a cross section of the fourth specific embodiment of the micromechanical oscillation system, in accordance with the present invention.
Figure 4A:
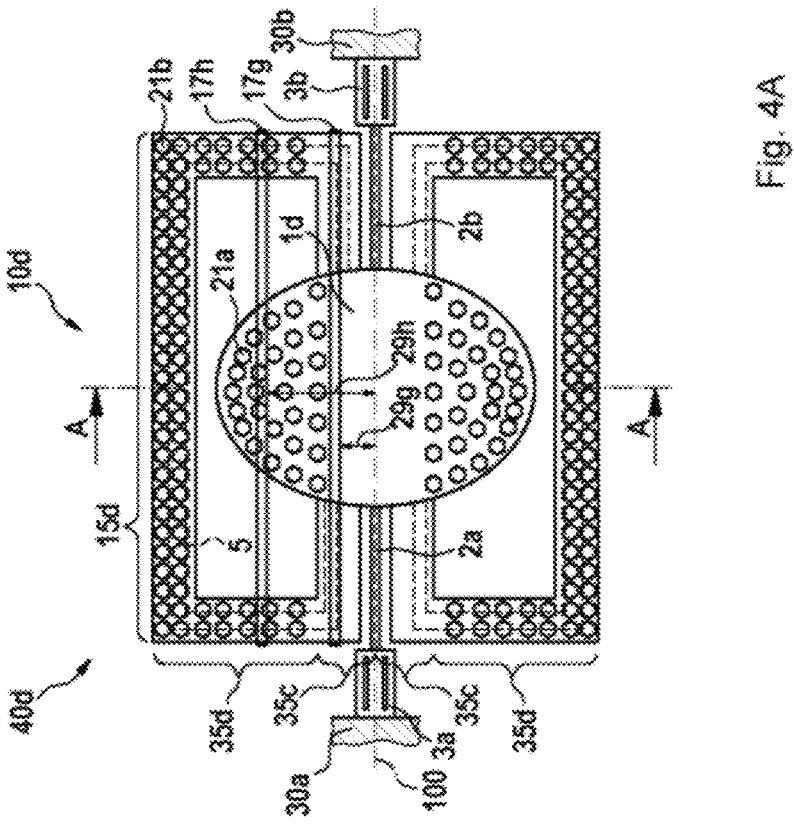
FIG. 4A shows a fourth specific embodiment of a micromechanical oscillation system in a top view, in accordance with the present invention.

FIGS. 4A and 4B show a fourth specific embodiment of a micromechanical oscillation system 40d including an oscillating body 10d. In contrast to the first, second, and third specific embodiments, micromirror 1d and also carrier unit 15d in an outer area 35d of micromechanical oscillation system 10d include a plurality of recesses 21a and 21b on both sides of oscillation axis 100. Recesses 21a and 21b each include the same extensions, and in a top view onto FIG. 4A have the shape of a hexagonal prism. Inner area 35c of micromechanical oscillation system 10d in turn includes no extensions. Due to recesses 21a and 21b in outer area 35d, section segment 17h has a smaller mass than section segment 17g in inner area 35c. Section segment 17h is situated at a greater distance 29h from oscillation axis 100 than section segment 17g, with distance 29g.

Figure 5B:
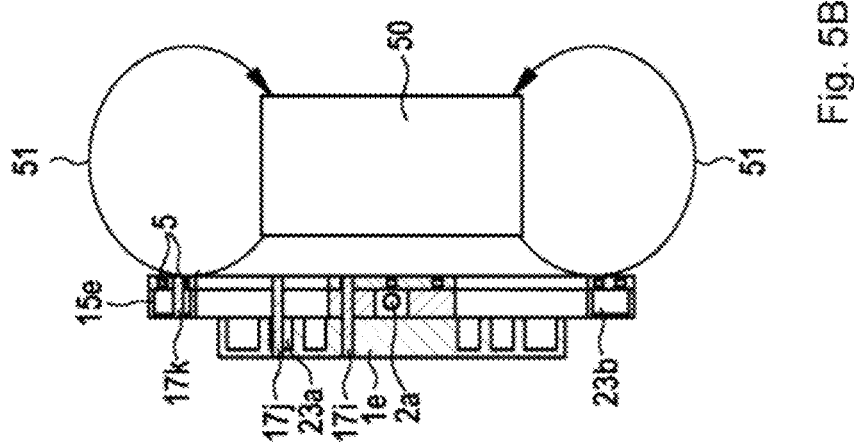
FIG. 5B shows a cross section of the fifth specific embodiment of the micromechanical oscillation system, in accordance with the present invention.
Figure 5A:
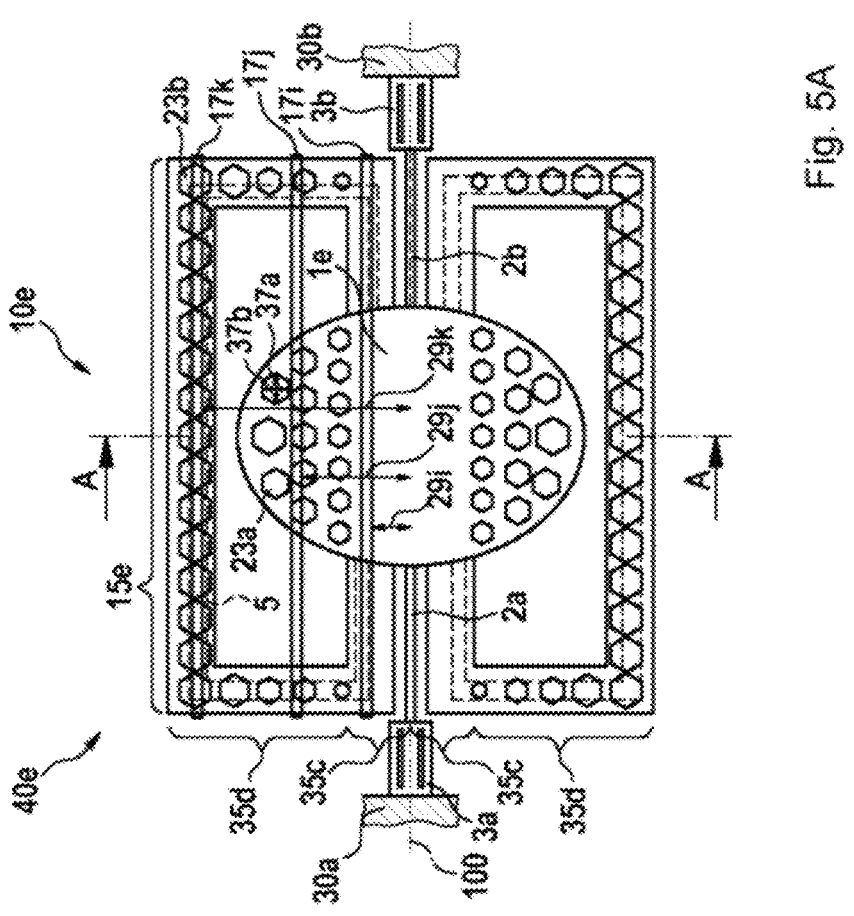
FIG. 5A shows a fifth specific embodiment of a micromechanical oscillation system in a top view, in accordance with the present invention.

FIGS. 5A and 5B show a fifth specific embodiment of a micromechanical oscillation system 40e including an oscillating body 10e. Micromirror 1e and also carrier unit 15e in outer area 35d of micromechanical oscillation system 10e include a plurality of recesses 23a and 23b on both sides of oscillation axis 100. In contrast to the fourth specific embodiment, the extensions of recesses 23a and 23b in longitudinal direction 37b and in transverse direction 37a of the recesses are different from one another. The farther the distance of recesses 23a and 23b from oscillation axis 100, the larger are recesses 23a and 23b. Due to the different sizes of recesses 23a and 23b as a function of the distance from oscillation axis 100, section segment 17k in outer area 35d with distance 29k has a smaller mass than section segment 17j in outer area 35d with distance 29j. In turn, section segment 17i without a recess in inner area 35c with distance 29i has a greater mass than section segments 17j and 17k. The system is thus mechanically stiffer.

Figure 6:
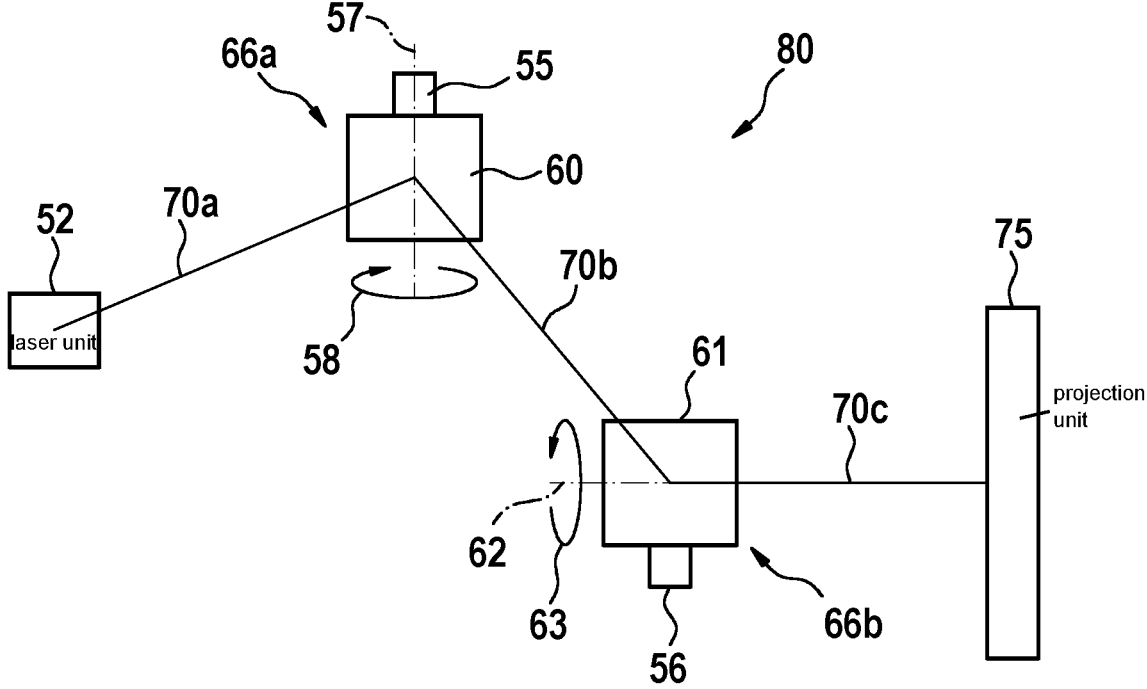
FIG. 6 schematically shows a microprojection device that includes the micromechanical oscillation system, in accordance with an example embodiment of the present invention.

FIG. 6 schematically shows a microprojection device 80 including micromechanical oscillation systems 66a and 66b. Micromechanical oscillating bodies 60 and 61 of the particular micromechanical oscillation system are designed as micromirrors that are driven with the aid of an associated drive unit 55 and 56, respectively. First micromirror 60 oscillates about oscillation axis 57 in oscillation direction 58, and second micromirror 61 oscillates about oscillation axis 62 in oscillation direction 63.

Second micromirror 61 has a greater total mass than first micromirror 60. Smaller masses in turn have intrinsically higher natural frequencies, for which reason first micromirror 60 is preferably operated at a higher frequency than second micromirror 61. For example, for the normal video projection, first micromirror 60 is therefore utilized for the horizontal deflection and second micromirror 61 is utilized for the vertical deflection. Second micromirror 61 may thus be electromagnetically operated in an energy-efficient manner. First micromirror 60 in turn, due to its frequency, may be operated resonantly and driven with the aid of piezoactuators, for example.

In addition to micromechanical oscillation systems 66a and 66b, such a microprojection device 80 includes a laser unit 52 that is designed to radiate light 70a of at least one wavelength onto the micromirror of micromechanical oscillation system 66a, from which, light 70b is in turn deflected onto the micromirror of micromechanical oscillation system 66b. The micromirror of micromechanical oscillation system 66b in turn is designed in such a way that light 70c of at least one wavelength is to be deflected onto a projection unit 75 as a function of a deflection of the micromirror of micromechanical oscillation system 66b.

Figure 7:
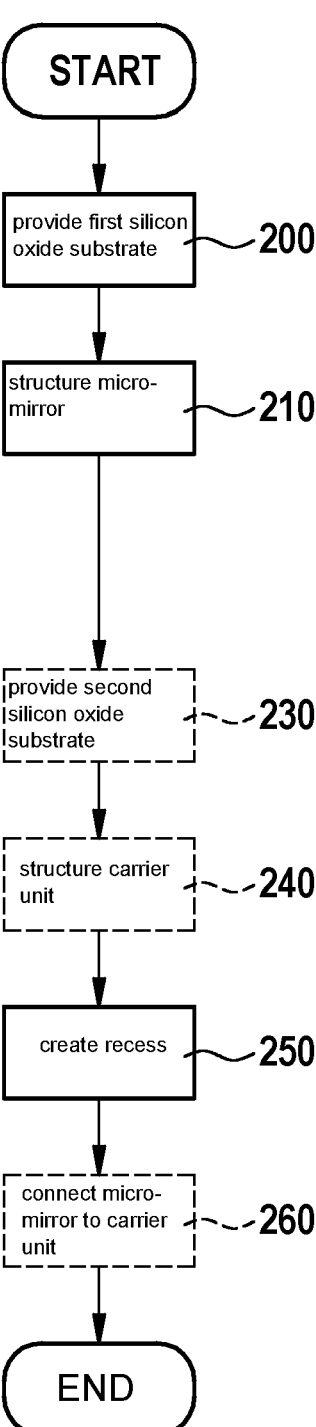
FIG. 7 shows a sequence of a method for manufacturing a micromechanical oscillation system, in accordance with an example embodiment of the present invention.

FIG. 7 shows in the form of a flowchart one specific embodiment of a method for manufacturing a micromechanical oscillation system as described by way of example for FIGS. 1A through 5B. A first silicon oxide substrate, for example in the form of a first silicon oxide wafer, is provided in a first method step 200. A micromirror of a micromechanical oscillating body is structured out of the first silicon oxide substrate in a subsequent method step 210. The micromirror may, for example, be etched out of the first silicon oxide substrate. At least one recess is created on both sides of an oscillation axis of the micromechanical oscillating body in an outer area of the micromechanical oscillating body situated relative to the oscillation axis in a subsequent method step 250. A first recess may be created with the aid of a first cavity, for example. The method is then ended.

In addition, a second silicon oxide substrate is provided in an optional method step 230. The second silicon oxide substrate is designed as a second silicon oxide wafer, for example. A carrier unit for carrying at least one coil unit of the micromechanical oscillating body is structured out of the second silicon oxide substrate in a subsequent optional method step 240. The carrier unit may, for example, be etched out of the second silicon oxide substrate. The micromirror is connected to the carrier unit in an optional method step 260 in order to form the micromechanical oscillating body including the micromirror and the carrier unit. The connection of the micromirror to the carrier unit takes place with the aid of a thin silicon oxide layer, for example. This thin silicon oxide layer may also be used as an etch stop in the structuring of the micromirror and the carrier unit out of the first and second silicon oxide substrates.

What is claimed is:

1. A micromechanical oscillation system, comprising:
a micromechanical oscillating body that includes at least one micromirror, the micromechanical oscillating body being configured to oscillate about an oscillation axis at a resonant frequency of the oscillating body, the micromechanical oscillating body having a total mass made up of mass elements, and the mass elements are distributed as a function of a lateral spacing of the mass elements from the oscillation axis,
wherein the micromechanical oscillating body additionally includes a carrier unit configured to carry at least one coil unit,
wherein in an outer area of the micromechanical oscillating body situated relative to the oscillation axis, the coil unit of the micromechanical oscillating body is made of a metal having a density less than 4 g/cm$^3$, the metal having the density less than 4 g/cm$^3$ being aluminum, and in an inner area of the micromechanical oscillating body situated relative to the oscillation axis is made of a metal having a density greater than 4 g/cm$^3$, the metal having the density greater than 4 g/cm$^3$ being copper.

2. The micromechanical oscillation system as recited in claim 1, wherein the micromechanical oscillation system is a micromirror system.

3. The micromechanical oscillation system as recited in claim 1, wherein a distribution of the mass elements is reduced as a function of the lateral spacing of the mass elements from the oscillation axis.

4. The micromechanical oscillation system as recited in claim 1, wherein the carrier unit is configured as two struts, one of the struts being situated on each side of the oscillation axis, and the struts being configured to span the coil unit.

5. The micromechanical oscillation system as recited in claim 1, wherein the micromirror in a top view completely covers the coil unit.

6. The micromechanical oscillation system as recited in claim 1, wherein in an outer area of the micromechanical oscillating body situated relative to the oscillation axis, the micromechanical oscillating body includes at least one recess on both sides of the oscillation axis.

7. The micromechanical oscillation system as recited in claim 6, wherein the at least one recess in a top view has the shape of a hexagonal prism.

8. The micromechanical oscillation system as recited in claim 6, wherein the at least one recess in a top view has a rectangular design.

9. The micromechanical oscillation system as recited in claim 6, wherein in the outer area of the micromechanical oscillating body situated relative to the oscillation axis, the micromechanical oscillating body includes a plurality of recesses on both sides of the oscillation axis, an extension of the recesses in a longitudinal direction and/or a transverse direction of the recesses increasing as a function of a lateral spacing of the recesses from the oscillation axis.

* * * * *